(12) United States Patent
Pothireddy

(10) Patent No.: US 12,040,752 B2
(45) Date of Patent: Jul. 16, 2024

(54) BANDGAP AMPLIFIER BIASING AND STARTUP SCHEME

(71) Applicant: TEXAS INSTRUMENTS INCORPORATED, Dallas, TX (US)

(72) Inventor: Venkateswara Reddy Pothireddy, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/188,064

(22) Filed: Mar. 22, 2023

(65) Prior Publication Data

US 2023/0223903 A1   Jul. 13, 2023

Related U.S. Application Data

(63) Continuation of application No. 17/592,305, filed on Feb. 3, 2022, now Pat. No. 11,637,534.

(60) Provisional application No. 63/246,823, filed on Sep. 22, 2021.

(51) Int. Cl.
*H03F 1/30* (2006.01)
*G05F 1/46* (2006.01)
*G05F 3/20* (2006.01)
*G05F 3/26* (2006.01)

(52) U.S. Cl.
CPC ............ *H03F 1/301* (2013.01); *G05F 1/468* (2013.01); *G05F 3/205* (2013.01); *G05F 3/262* (2013.01); *H03F 2200/447* (2013.01)

(58) Field of Classification Search
CPC .. H03F 1/301; H03F 2200/447; H03F 1/0272; H03F 1/303; G05F 1/468; G05F 3/205; G05F 3/262; G05F 1/463; G05F 3/30; G05F 1/567; G05F 3/245; G05F 1/301; G05F 2200/447; H03K 5/24; H03K 3/011
See application file for complete search history.

(56) References Cited

U.S. PATENT DOCUMENTS

| | | | |
|---|---|---|---|
| 6,020,792 A | 2/2000 | Nolan et al. | |
| 6,400,207 B1* | 6/2002 | Ivanov | G05F 3/30 |
| | | | 327/377 |
| 6,677,808 B1 | 1/2004 | Sean et al. | |
| 9,342,084 B1* | 5/2016 | Konecny | H03K 5/24 |
| 10,429,879 B1* | 10/2019 | Coimbra | G05F 3/30 |
| 2019/0132924 A1* | 5/2019 | Fan | H05B 45/397 |
| 2020/0019202 A1* | 1/2020 | Kaur | G05F 3/262 |

* cited by examiner

*Primary Examiner* — Lincoln D Donovan
*Assistant Examiner* — Tyler J Pereny
(74) *Attorney, Agent, or Firm* — Michael T. Gabrik; Frank D. Cimino

(57) ABSTRACT

Systems and circuits include an amplifier having an output; a switching circuit coupled to the output of the amplifier to provide a bias current to bias the amplifier; first current generating circuitry coupled to the switching circuit; and second current generating circuitry coupled to the output of the amplifier and to the switching circuit. In operation, the switching circuit provides the bias current, during a first time period, in response to a first signal generated by the first current generating circuitry, and provides the bias current, during a second time period, after the first time period, in response to a second signal generated by the second current generating circuitry.

19 Claims, 4 Drawing Sheets

BANDGAP AMPLIFIER BIASING AND STARTUP SCHEME

CROSS-REFERENCE TO RELATED APPLICATIONS

This application is a continuation of, and claims priority under 35 U.S.C. § 120 on, U.S. patent application Ser. No. 17/592,305, filed Feb. 3, 2022, which claims the benefit under 35 U.S.C. § 119 to Provisional Application No. 63/246,823, filed Sep. 22, 2021, both of which are incorporated by reference herein.

BACKGROUND

A bandgap reference voltage circuit produces a fixed reference voltage regardless of power supply variations, temperature changes, process variations, or other external factors. The circuit provides the fixed reference voltage based on the bandgap of silicon. The bandgap reference voltage circuit generates a reference voltage at a first node that is proportional to temperature, and another reference voltage at a second node that is inversely proportional to temperature. Those reference voltages are multiplied by a factor and summed with an amplifier to produce a stable reference voltage that is independent of temperature, process variations, etc.

SUMMARY

In an example, a system comprises an amplifier having an output; a switching circuit coupled to the output of the amplifier and configured to provide a bias current to bias the amplifier; first current generating circuitry coupled to the switching circuit; and second current generating circuitry coupled to the output of the amplifier and to the switching circuit. The switching circuit is further configured to provide the bias current, during a first time period, in response to a first signal generated by the first current generating circuitry, and provide the bias current, during a second time period, in response to a second signal generated by the second current generating circuitry. The second time period is after the first time period.

In another example, a switching circuit comprises a constant current source; first and second transistors coupled to the constant current source in a current mirror configuration. Each of the first and second transistors has a control terminal, a first current terminal, and a second current terminal, in which the second current terminal of the first transistor coupled to the constant current source, and the second current terminal of the second transistor forms a current output of the switching circuit. The switching circuit further comprises first and second controlled current sources. The first controlled current source has an output coupled to the second current terminal of the first transistor, and is configured to deliver a first controlled current that is based on a proportional to absolute temperature (PTAT) current. The second controlled current source has an output coupled to the second current terminal of the second transistor, and is configured to deliver a second controlled current that is based on the PTAT current.

Another example entails a method. The method comprises generating a startup current using first and second transistors and a constant current source coupled as a current mirror; generating a bias current for an amplifier using the startup current; generating a bandgap voltage based on operation of the amplifier; activating and operating first and second controlled current sources to deliver first and second controlled currents, respectively, based on a proportional to absolute temperature (PTAT) current; generating an operating current using the second controlled current source; and turning off the first transistor when the first controlled current reaches a threshold level.

BRIEF DESCRIPTION OF THE DRAWINGS

The same reference numbers or other reference designators are used in the drawings to designate the same or functionally and/or structurally similar features.

DETAILED DESCRIPTION

Figure 1A:
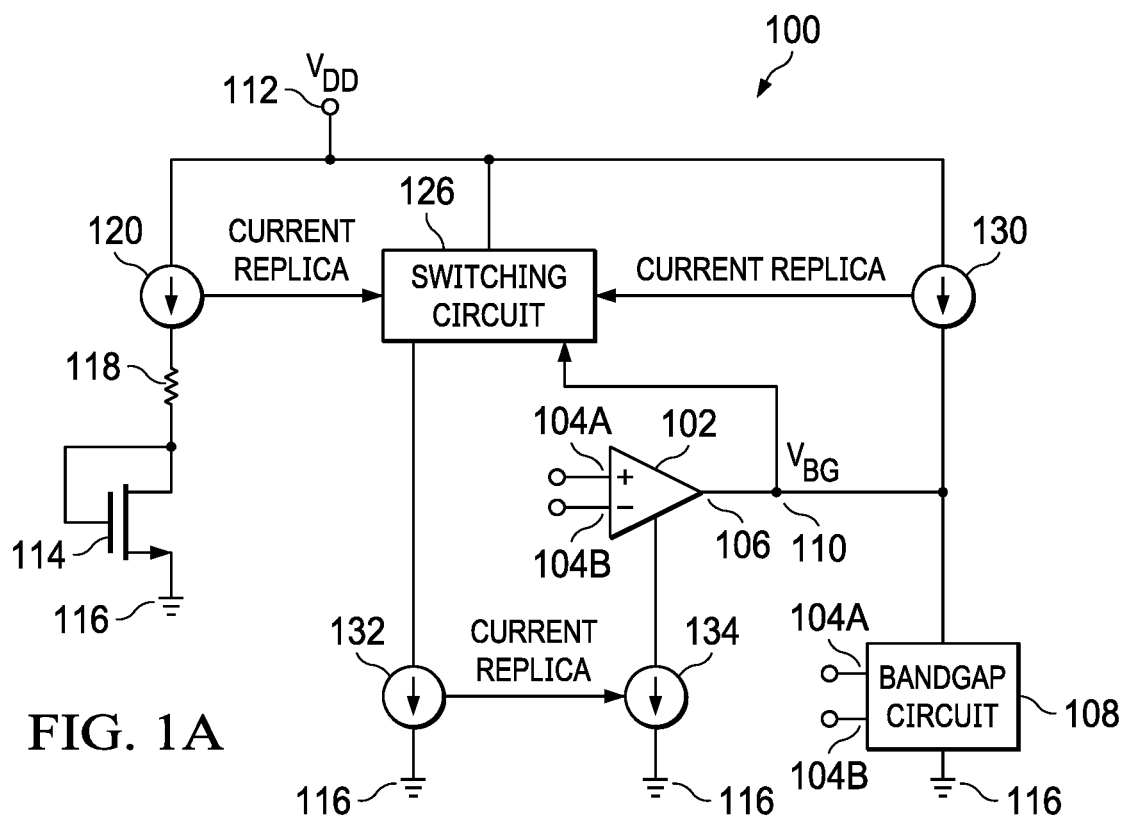
FIG. 1A is a circuit diagram of a system for bandgap amplifier biasing in accordance with various examples.

A conventional circuit used to create a bandgap voltage reference may have two transistors, where one transistor is a scaled version of the other. The transistors are often bipolar junction transistors (BJTs). Additional circuitry generates a proportion of two voltages, often by using resistors. Then, an amplifier sums the two voltages and produces an output voltage called the bandgap voltage reference, which is based on the bandgap voltage of the transistors. The amplifier is biased with biasing circuitry to ensure proper operation of the amplifier and produce a stable bandgap voltage reference at the output of the amplifier. Many bandgap circuits designed for commercial applications typically operate within ±10% variance in the voltage supply and between −40 and 125 degrees Celsius. However, the bandgap voltage reference for some applications, such as automotive applications, may need to support a wider range of voltage supplies (e.g., ±15%) and temperatures (e.g., −40 to 150 degrees Celsius). Designing amplifiers that provide robust operation with a large input voltage range (such as a supply voltage that varies ±15% from a programmed value) and a wide temperature range (such as −40 to 150 degrees Celsius) may present several challenges.

In one conventional circuit, a proportional-to-absolute temperature (PTAT) current is used for biasing a bandgap amplifier. A PTAT current is a current that has a positive temperature coefficient (e.g., the current increases with an increase in temperature, and decreases with a decrease in temperature). However, because the PTAT current is generated from the bandgap voltage of one or more diodes or transistors in the conventional solution, the PTAT current is available only after the bandgap amplifier in the circuit is stable. More specifically, circuitry is enabled during startup of the bandgap amplifier to provide an auxiliary bias current to bias the bandgap amplifier. After the bandgap amplifier starts up and is stable, circuitry switches the auxiliary bias current for the PTAT bias current, such that the PTAT bias current is thereafter used to bias the bandgap amplifier. Use of the PTAT bias current to bias the bandgap amplifier provides stable bias for the amplifier in light of temperature or process variations. The timing of the switch from the auxiliary bias current to the PTAT bias current is based on the value of the bandgap voltage of the transistors. However, basing the switch on this bandgap voltage may make the conventional solution unstable in certain situations, such as extreme temperatures or large variations in supply voltage. The auxiliary bias current used during startup may spike and cause instability in the amplifier during these conditions.

In examples herein, a reliable amplifier biasing circuit supports wide temperature and input voltage variations and produces a stable bias current. Rather than using the bandgap voltage reference produced by the bandgap amplifier for biasing and switching, the examples herein use the PTAT current as a reference to determine switching from the auxiliary bias current to the PTAT current. Using the PTAT current as a reference for biasing and switching, rather than the bandgap voltage reference, produces a more stable and reliable switch in light of temperature, voltage, and process variations. More specifically, circuitry described herein generates a startup current that provides a reliable bias current to the bandgap amplifier during startup. As the bandgap amplifier starts up, the PTAT current increases and is used as a reference to begin decreasing the startup current. The PTAT current, or a current based on the PTAT current, takes over biasing for the startup current after the bandgap amplifier completes startup. Therefore, at steady state operation, the PTAT current or a current based on the PTAT current biases the amplifier. In examples herein, if the PTAT current drops during operation, circuitry is configured to again provide the startup current to bias the bandgap amplifier until the PTAT current increases to a suitable level.

Figure 1B:
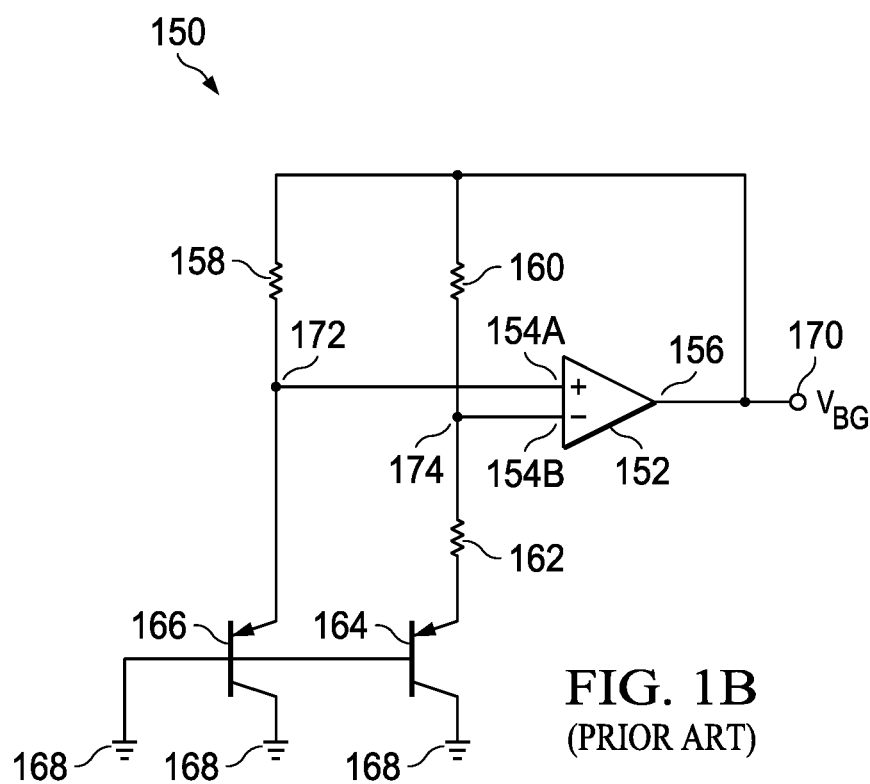
FIG. 1B is a circuit diagram of a system for creating a bandgap voltage reference in accordance with various examples.

FIG. 1A is a block diagram of a system 100 for bandgap amplifier biasing in accordance with various examples herein. FIG. 1A is a simplified block diagram of components that provide bandgap amplifier biasing. FIG. 1A shows an example concept of bandgap amplifier biasing with components in the block diagram that represent various functions performed by circuitry in some examples. FIG. 1B is an example of a conventional circuit useful for creating a bandgap voltage reference with a bandgap amplifier that may be used in combination with FIG. 1A. The details and operation of FIG. 1B are described below. In FIG. 1A, system 100 includes a bandgap amplifier 102 (referred to herein as amplifier 102), which is biased by the additional circuitry included in system 100. Amplifier 102 includes a first amplifier input 104A, a second amplifier input 104B, and an amplifier output 106. First amplifier input 104A and second amplifier input 104B receive their respective voltages from a bandgap circuit 108 and are used by amplifier 102 to produce a bandgap voltage reference ($V_{BG}$) at node 110. As described in the context of FIG. 1B, those voltages are produced with transistors and resistors in some examples. FIG. 1B provides an example of the circuitry of the bandgap circuit 108 coupled to inputs of a bandgap amplifier 102 to create a $V_{BG}$ at node 110.

System 100 includes bandgap circuit 108. Bandgap circuit 108 is coupled to node 110. System 100 also includes a supply voltage 112 ($V_{DD}$). System 100 includes transistor 114 (e.g., a FET) coupled to ground 116 and resistor 118. Transistor 114 may be a diode-connected transistor, or may be replaced with a diode in some examples. Transistor 114 and resistor 118 produce a voltage-dependent current in one example. Resistor 118 is coupled to current source 120. Current source 120 may be any circuitry that provides a startup current for amplifier 102, and may be coupled differently to other components in system 100 in other examples. Current source 120 may include components not shown in FIG. 1A in some examples. Transistor 114, resistor 118, and current source 120 generate a bias current during startup and provide a current replica signal (e.g., a replicated current) that may be used to control the amount of bias current for the amplifier 102 provided by current source 134 as described below. Switching circuit 126 includes suitable circuitry that controls the current through current source 132 based on either a replica of an auxiliary bias current from current source or a replica of a PTAT current from current source 130. Current source 134 provides the bias current to amplifier 102 by receiving a replica of current from current source 132. Switching circuit 126 switches between the auxiliary bias current and the PTAT current responsive to a trigger, wherein the trigger is a variable in system 100, such as a voltage or a current. In an example, switching circuit 126 receives a current replica signal from current source 120, a current replica signal from current source 130, and a voltage $V_{BG}$ from node 110. Switching circuit 126 provides a current (e.g., current source 132) that is replicated with current source 134 so current source 134 may provide a bias current to amplifier 102.

Current sources described herein may include any circuitry (e.g., transistors coupled to voltage sources) suitable to provide a current. The current sources described herein may also be configured to provide a current that is proportional to another current described herein in some examples. The current sources described herein may provide a variable current in some circumstances based on the operation of system 100. The current sources described herein may be turned on or off via additional circuitry not shown in system 100.

In operation, a startup current for biasing amplifier 102 is provided by transistor 114, resistor 118, and current source 120. Switching circuit 126 operates to provide a replica of current from current source 120 to current source 132, where the current is then replicated and provided to current source 134, which biases amplifier 102 with the replicated current from current source 134. In other examples, the startup current for biasing amplifier 102 may be provided by any suitable circuitry. In some examples, this startup current may vary with temperature, voltage, and/or process. Therefore, the startup current may not be suitable for proper operation of amplifier 102 after startup. Switching circuit 126 is provided in examples herein to switch from the startup current to a current that is more resistant to temperature, voltage, or process, such as PTAT current 130 or a current proportional to PTAT current 130.

During startup of amplifier 102, bias current for amplifier 102 is provided by current source 120. After amplifier 102 begins operation, amplifier 102 and bandgap circuit 108 provide a PTAT current from current source 130. Amplifier 102 produces a bandgap voltage reference $V_{BG}$ at amplifier output 106 (e.g., at node 110), which is provided to bandgap circuit 108 and used to bias bandgap circuit 108 and provide a PTAT current from current source 130. PTAT current 130 increases as amplifier 102 begins more fully operating (which increases the bandgap voltage reference value at amplifier output 106), and PTAT current 130 is also provided to amplifier 102 as the bias current from current source 134, via the operation of switching circuit 126. Switching circuit 126 may provide a current to current source 132 that is proportional to a value of PTAT current 130. Switching circuit 126 may contain any suitable circuitry that replicates PTAT current 130 in a suitable proportion. As PTAT current 130 increases, current provided by switching circuit 126 increases. In response, control of bias current from current source 134 is gradually switched over from the startup current (provided by current source 120) to a current proportional to PTAT current 130 via switching circuit 126. Therefore, after switching circuit 126 is triggered, bias current from current source 134 is governed by current source 130 rather than current source 120. In one example, the switchover from current source 120 to current source 130 triggers based on a value of PTAT current 130, and switching circuit 126 is designed to switch between current sources 120 and 130 based on a PTAT current reaching a predetermined threshold. Switching circuit 126 and the other components of system 100 therefore provide a startup current (from current source 120) for biasing amplifier 102 and also provide a smooth transition to a current based on PTAT current (from current source 130) for biasing amplifier 102. Examples herein provide a stable and robust bias current from current source 134 for amplifier 102. With a stable bias current from current source 134, the startup process for the bandgap voltage reference $V_{BG}$ may be provided across a wide range of voltage and temperature variations.

FIG. 1B is a circuit diagram of a conventional system 150 for creating a bandgap voltage reference with a bandgap amplifier. Examples herein, such as FIG. 1A and FIG. 2, omit the details of the conventional bandgap voltage reference circuit as shown in FIG. 1B for simplicity, and instead provide details of the circuitry that biases the amplifier such as amplifier 102. A number of variations exist for creating a bandgap voltage reference, and FIG. 1B is merely one example. In general, to create a bandgap voltage reference, circuitry generates a proportion of two voltages or two currents, often by using resistors. Then, circuit components such as an amplifier sum the two voltages or two currents and produce the bandgap voltage reference $V_{BG}$. The examples described herein for biasing an amplifier such as amplifier 102 may be useful in any suitable bandgap voltage reference circuit, of which FIG. 1B is merely one example.

System 150 includes an amplifier 152 that has a first amplifier input 154A, a second amplifier input 154B, and an output 156. Amplifier 152 may be similar to amplifier 102 in an example. System 150 also includes resistors 158, 160, and 162. System 150 includes transistor 164 and 166 and ground 168. System 150 includes an output node 170 that provides the bandgap voltage $V_{BG}$, and nodes 172 and 174. In operation, system 150 generates a stable reference voltage $V_{BG}$ at output node 170. System 150 produces a first reference voltage at a first node (such as node 172) that is proportional to temperature, and a second reference voltage at a second node (such as node 174) that is inversely proportional to temperature. The relative sizes of transistors 164 and 166 to one another and the relative sizes of resistors 158, 160, and 162 to one another are selected to produce a specific proportion between the first and second reference voltages. The first and second voltage reference voltages are provided to amplifier 152 and a stable reference voltage $V_{BG}$ is produced that is resistant to changes in temperature, voltage, and process.

Figure 2:
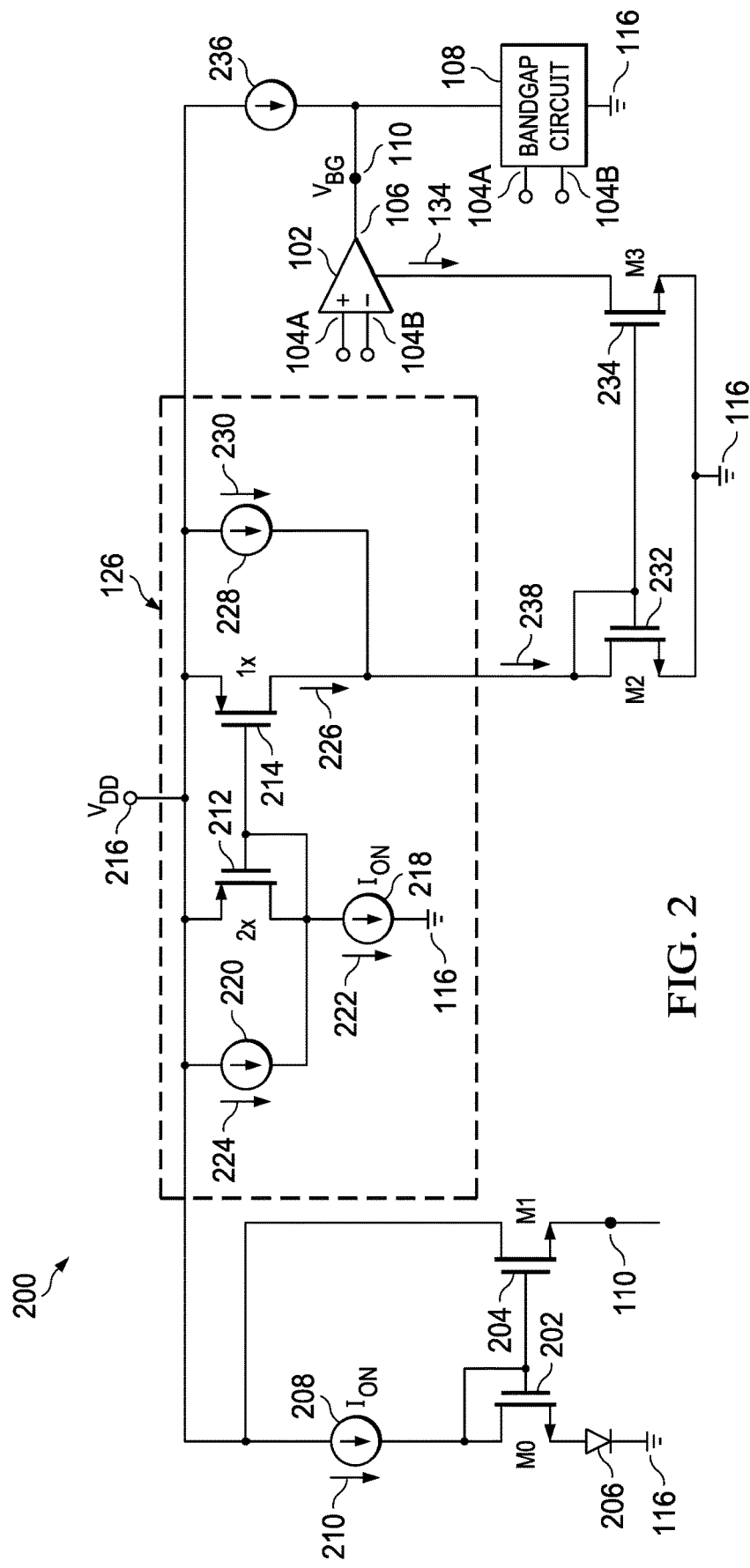
FIG. 2 is a circuit diagram of a system for bandgap startup and bandgap amplifier biasing in accordance with various examples.

FIG. 2 is a circuit diagram of a system 200 for bandgap amplifier biasing in accordance with various examples herein. In FIG. 2, the same reference numbers or other reference designators are used as in FIG. 1A to designate the same or similar (functionally and/or structurally) features. System 200 includes one example of circuitry for switching circuit 126 as described above, shown as a dashed box in FIG. 2. In other examples, switching circuit 126 may be implemented in different circuitry that operates similarly to the examples described herein. The components in system 200 provide a startup current (e.g., current source 120 in FIG. 1A), a steady state bias current for amplifier 102 (e.g., current source 134 in FIG. 1A), and circuitry that switches between these two currents based at least in part on a PTAT current (e.g., switching circuit 126). The current sources in FIG. 2 include suitable circuitry that provides programmed current(s) based on the operation of system 200. The programmed current(s) may vary based on the operation of system 200, and the current sources may produce a current that is based on another current in system 200 or is a ratio of another current in system 200. The current sources in system 200 may be turned on or off by other components in system 200 based on the operation of system 200.

In examples, system 200 includes transistors M0 202 and M1 204. Transistors M0 202 and M1 204 may be n-channel field effect transistors (FETs) in one example. A gate of M0 202 is coupled to a gate of M1 204 and to the source of M0 202. A drain of M0 202 is coupled to diode 206, which is coupled to ground 116. The drain of M1 204 may be coupled to additional circuitry to bias M1, not shown in FIG. 2. A current source 208 provides a current $I_{ON}$ 210. Current source 208, transistors M0 202 and M1 204, and diode 206 provide the startup current for amplifier 102 as described below.

System 200 also includes transistors 212 and 214. Transistors 212 and 214 may be p-channel FETs in one example. In this example, transistors 212 and 214 have a size ratio, such as transistor 212 being twice as large as transistor 214. Other ratios may be useful in other examples. A gate of transistor 212 is coupled to a gate of transistor 214. A source of transistor 212 is coupled to a source of transistor 214, and both sources are coupled to a node 216 that provides a voltage $V_{DD}$. A drain of transistor 212 is coupled to a current source 218 and a current source 220. Current source 218 is coupled to ground 116 and provides a current 222, and current source 220 provides a current 224. Transistors 212 and 214 operate as a current mirror that produces a startup current 226. A drain of transistor 214 is also coupled to a current source 228 that produces a current 230. Current sources 220 and 228 may provide currents 224 and 230, respectively, that are scaled versions of PTAT current 236, which is described below. The ratio of these currents (224, 230, 236) may vary in some examples. Current sources 220 and 228 represent circuitry that is designed to receive PTAT current 236 or another signal that is indicative of PTAT current 236 and produce a programmed current based on the value of PTAT current 236. These programmed currents produced by current sources 220 and 228 are useful within system 200 to perform the operations of system 200, including the switching circuit 126 to switch from a startup current to a steady state current based on PTAT current 236 for biasing amplifier 102. These programmed currents may vary during the operation of system 200, based on changes in PTAT current 236. Current sources 220 and 228 may include circuitry to perform functions other than providing a current in some examples.

System 100 also includes transistors M2 232 and M3 234. A gate of transistor M2 232 is coupled to a gate of transistor M3 234. Transistors M2 232 and M3 234 may be n-channel FETs in one example. The gate of transistor M2 232 is coupled to a drain of transistor M2 232. The source of transistor M2 232 and the source of transistor M3 234 are coupled to ground 116. Transistors M2 234 and M3 234 provide a current mirror that produces a bias current (shown as current 134) for amplifier 102. Amplifier 102 provides the bandgap voltage at node 110 and a PTAT current 236 through bandgap circuit 108, as described above. As described above with respect to FIG. 1A, the transistors, resistors, and/or other circuitry that is coupled to amplifier inputs 104A and 104B is omitted from FIG. 2 for simplicity. FIG. 1B provides an example of the circuitry coupled to inputs of a bandgap amplifier to create a bandgap voltage reference. Similar circuitry may be coupled to amplifier 102 in system 200 in one example. The PTAT current 236 produced via the output of amplifier 102 is useful for biasing amplifier 102 after amplifier 102 starts up in some examples. Current 238 in system 200 is the current provided to the current mirror of transistor M2 232 and transistor M3 234, which may be a current from current source 132 in FIG. 1A in one example. During operation, current 238 may include startup current 226, current 230, or a combination of these currents as described below.

The connections for amplifier 102 are described above with respect to FIG. 1A. Referring again to FIG. 2, the circuitry in system 200 provides a startup current to bias amplifier 102 (e.g., current source 120 in FIG. 1A) and also provide a smooth transition to PTAT current 236 or a current based on PTAT current 236 for biasing amplifier 102 (e.g., current source 134 in FIG. 1A). The operation of system 200 is described below together with the description of the waveforms shown in FIG. 3.

Figure 3:
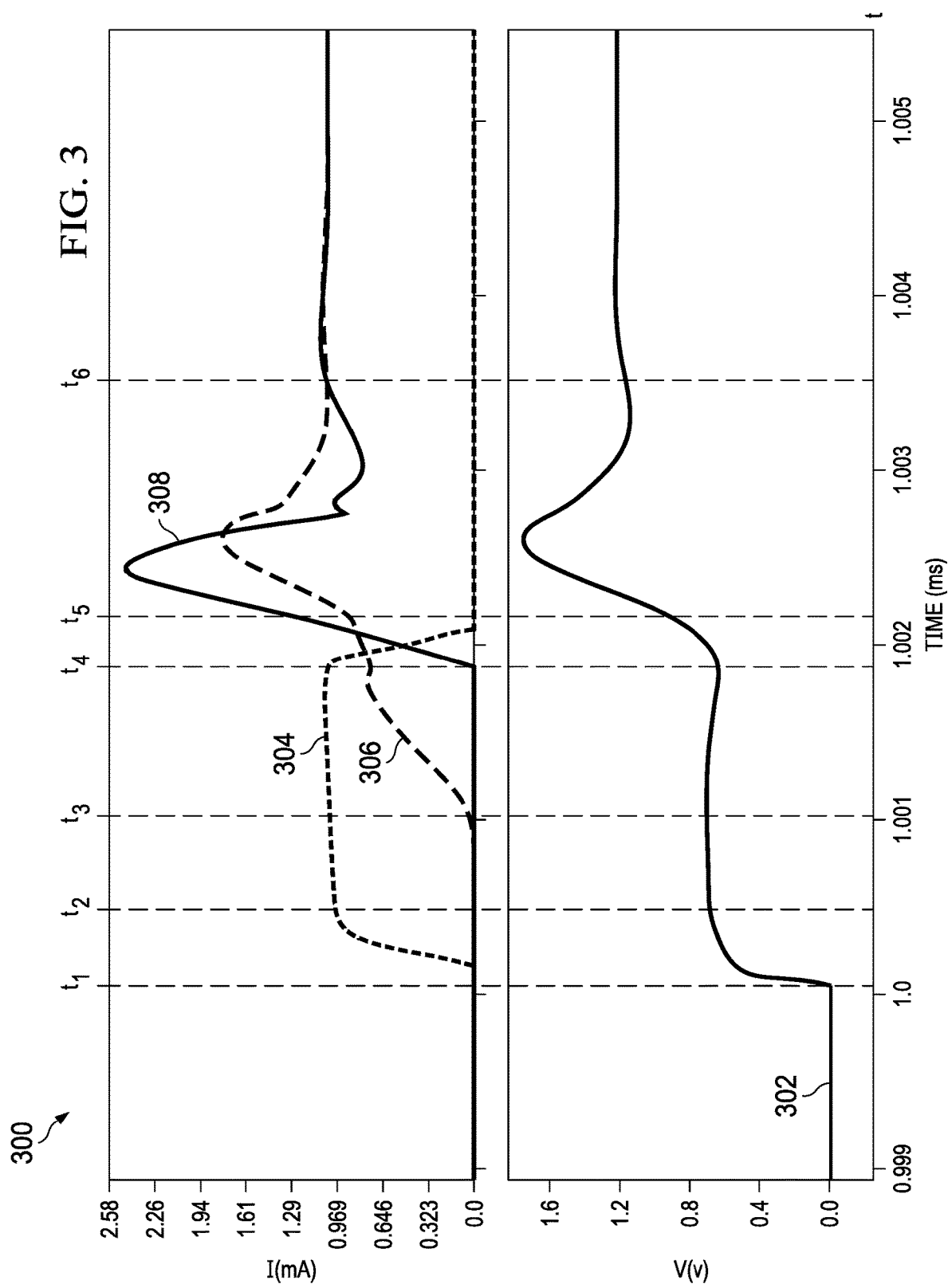
FIG. 3 is a collection of waveforms for a bandgap amplifier biasing circuit in accordance with various examples.

FIG. 3 is a collection of waveforms 300 for a bandgap amplifier biasing circuit in accordance with various examples herein. In FIG. 3, the x-axis for each graph is time in milliseconds (ms). The top graph of FIG. 3 has a y-axis that represents current in milliamps (mA). The bottom graph of FIG. 3 has a y-axis that represents voltage in volts (V). The bottom graph includes waveform 302, which represents the bandgap voltage $V_{BG}$ at node 110 in FIGS. 1A and 2.

The top graph of FIG. 3 includes waveforms 304, 306, and 308. Waveform 304 represents the startup current 226, provided from transistor 214 to transistor M2 232. Waveform 306 represents the bias current from current source 134 provided to amplifier 102. Waveform 308 represents the current 230 provided by current source 228, which is proportional to PTAT current 236.

In operation, transistors 202 and 204, along with other circuitry such as current source 208 produce a startup current for amplifier 102, which may be represented by current 226 during startup in an example. Current $I_{ON}$ 210 and current $I_{ON}$ 222 are proportional to each other and may be equal in an example. Currents 210 and 222 may be produced by a supply voltage across a resistor, and therefore are always on in the presence of a supply voltage and remain relatively stable during operation of system 200. These currents help to provide an initial startup for the circuit so that the circuit does not remain in a non-functional state. At startup (e.g., before time $t_1$ in FIG. 3), the PTAT current 236 through bandgap circuit 108 is approximately zero. Because PTAT current 236 is zero, currents 230 and 224 are also zero initially. As described above, current sources 220 and 228 may be circuitry that produces a current that is proportional to PTAT current 236. In this example, if PTAT current 236 is zero, current sources 220 and 228 produce currents that are a multiple of PTAT current 236, so currents 230 and 224 are also zero. Therefore, startup current 226 has a value of a ratio of $I_{ON}$ (e.g., current 222). Transistors 212 and 214 provide the ratio of current 222 based on their relative sizes. In this example, current 222 is twice the size of startup current 226 at this time because transistor 212 is twice the size of transistor 214. A different ratio of transistors 212 and 214 may be useful in other examples. During startup, startup current 226 may be equivalent to current 238, which is mirrored by transistors M2 232 and M3 234 to provide the bias current 134 to amplifier 102.

Referring again to FIG. 3, after time $t_1$, startup current 226 (e.g. waveform 304) begins rising. Startup current 226 is provided to amplifier 102 via transistors M2 232 and M3 234. Also, at time $t_1$, bandgap voltage $V_{BG}$ (waveform 302) begins rising and becomes stable near time $t_2$. Bandgap voltage $V_{BG}$ is the voltage at node 110, which rises after time $t_1$ due to amplifier 102 beginning operation and providing an output voltage at amplifier output 106. Also, between times $t_1$ and $t_2$, the startup current 226 (waveform 304) rises to a steady state and maintains a relatively stable current after time $t_2$. Therefore, system 200 provides a steady and reliable startup current 226 for amplifier 102 across a range of voltage and temperature, approximately between times $t_1$ and $t_4$. The startup current 226 is provided to bias the amplifier 102 until current 230 can replace the startup current 226 and bias the amplifier 102.

At time $t_3$, bias current 134 (provided to amplifier 102) begins increasing (e.g., waveform 306). At this time, bias current 134 is provided by startup current 226. At time $t_4$, amplifier 102 begins operating more fully due to the increase in bias current 134, and PTAT current 236 begins increasing. The increase in PTAT current 236 is due to an increase in the voltage provided by amplifier 102 at amplifier output 106, which in turn is caused by the increase in bias current 134. In system 200, currents 224 and 230 are produced by circuitry that mirrors PTAT current 236 (subject to a programmed ratio), and therefore currents 224 and 230 also begin increasing as PTAT current 236 increases at time $t_4$. Waveform 308 in FIG. 4 indicates that current 230 rises at time $t_4$. In one example, current 230 may be 1/16 of PTAT current 236, but other ratios may be useful in other examples.

As current 230 increases after time $t_4$, current 230 begins providing current to the current mirror of transistors M2 232 and M3 234 (e.g., current 238), and current 230 begins exceeding the startup current 226. Between times $t_4$ and $t_5$, amplifier 102 turns on more fully, and current 230 continues to increase due to the increase in PTAT current 236. Also, because current 230 increases, startup current 226 (waveform 304) is no longer needed for biasing amplifier 102. Therefore, the startup current 226 may be turned off after time $t_4$ in the operation of system 200. In this example, startup current 226 is turned off by current source 220. In an example, current source 220 provides a current that is a mirrored ratio of current 230, such as 4x or 5x the size of current 230. Other ratios may be used in other examples. Current source 220 is configured to produce a current 224 that turns off transistor 212 after current 224 reaches a predetermined threshold. Turning off transistor 212 may be performed with any suitable circuitry or method, such as producing a current or voltage via the circuitry of current source 220 that biases transistor 212 in such a way that turns off transistor 212. Therefore, as the PTAT current 236 increases (indicating amplifier 102 is turning more fully on), current 224 increases, and the increase in current 224 turns off transistor 212. Turning off transistor 212 stops startup current 226 from being provided to transistor M2 232. After transistor 212 turns off around time $t_4$, current source 228 provides current 230 to amplifier 102 to bias amplifier 102. Waveform 304 in FIG. 3 shows that startup current 226 drops to zero between times $t_4$ and time $t_5$.

At around time $t_6$ in FIG. 3, amplifier 102 has reached steady state operation. At time $t_6$, bias current 134 (waveform 306), current 230 (waveform 308), and bandgap voltage $V_{BG}$ (waveform 302) are stable and operating at a steady state.

The values and sizes of the circuit components in system 200 may be selected so current 230 (or another current) cuts off or reduces startup current 226 with appropriate timing for the stable operation of amplifier 102. The components may be selected so the circuitry that provides startup current 226 turns off or begins to turn off as current 230 (or another current) reaches a predetermined threshold. In examples, startup current 226 may begin to reduce as current 230 reaches a first predetermined threshold, and may become zero as current 230 reaches a second predetermined threshold.

In examples, if PTAT current 236 drops for any reason, currents 224 and 230 also drop (because they are proportional to PTAT current 236 as described above), and transistors 212 and 214 may turn back on to again provide startup current 226 to transistor M2 232. Therefore, even after the startup process is complete, the startup circuitry (such as transistors M0 202, M1 204, 212, 214, etc.) may turn back on to provide bias current 134 if needed.

In examples herein, startup circuitry provides a first current (e.g., a startup current) to bias amplifier 102. After amplifier 102 begins operation, a second current (e.g., a current based on a PTAT current) is provided to bias amplifier 102. Rather than using the bandgap voltage reference produced by the bandgap amplifier for biasing and switching, the examples herein use the PTAT current as a reference to determine switching from the startup current to the PTAT current. Using the PTAT current as a reference for biasing and switching, rather than the bandgap voltage reference, produces a more stable and reliable switch in light of temperature, voltage, and process variations. The examples herein support wide temperature and input voltage variations and produce a stable bias current. The switching circuit 126 based on the PTAT current may be implemented with any suitable circuitry.

Figure 4:
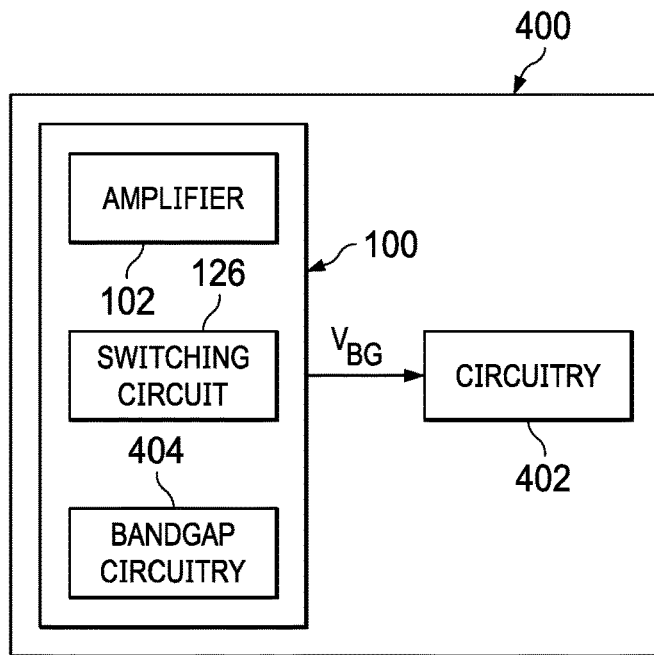
FIG. 4 is a block diagram of a device that implements a bandgap amplifier biasing scheme in accordance with various examples.

FIG. 4 is a block diagram of a device 400 that includes a bandgap amplifier biasing scheme in accordance with various examples herein. Device 400 includes system 100 and circuitry 402. System 100 includes amplifier 102 and switching circuit 126, as described above with respect to FIG. 1A. System 100 also includes bandgap circuitry 404, which is circuitry coupled to amplifier 102 and switching circuit 126 that produces the bandgap voltage $V_{BG}$ as described, for example, with respect to FIGS. 1A and 1B above. In examples, switching circuit 126, amplifier 102, and bandgap circuitry 404, along with additional circuitry not shown in FIG. 4, provide a bandgap voltage $V_{BG}$ to circuitry 402 in an example. Circuitry 402 may be any analog or digital circuitry that receives a stable bandgap voltage $V_{BG}$ that is independent of variations in voltage, temperature, and other factors.

As described in examples herein, switching circuit 126 provides stable bias currents to amplifier 102 during startup and during steady state operation of amplifier 102. Switching circuit 126 is configured to switch between a startup current (e.g., startup current 226) and a current that is proportional to a PTAT current (e.g., current 230) for biasing amplifier 102. Biasing amplifier 102 with switching circuit 126 as described herein provides a stable bandgap voltage $V_{BG}$ that circuitry 402 may use for its operation. In some examples, circuitry 402 is a component of an electronic device for an automotive or industrial application that may experience variations in supply voltage and/or operating temperature. With the examples herein, a stable bandgap voltage $V_{BG}$ is provided for these applications.

Figure 5:
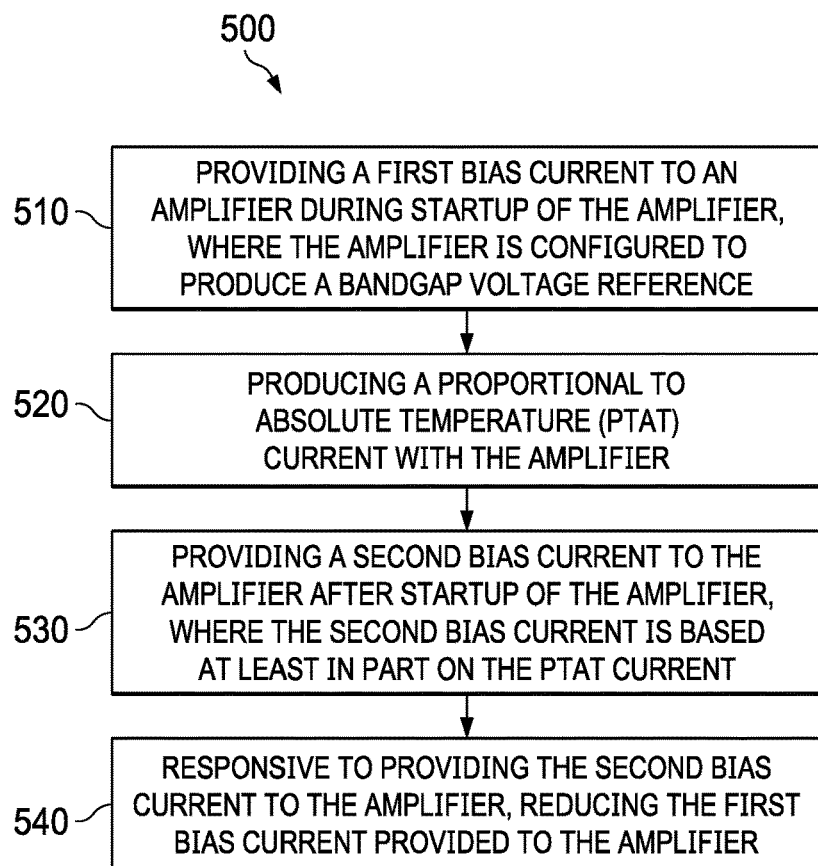
FIG. 5 is a flow diagram of a method for bandgap amplifier biasing in accordance with various examples.

FIG. 5 is a flow diagram of a method 500 for bandgap amplifier biasing in accordance with various examples herein. The steps of method 500 may be performed in any suitable order. The hardware components described above with respect to FIGS. 1-2 may perform method 500 in some examples.

Method 500 begins at 510, where a first current source provides a first bias current to an amplifier during startup of the amplifier, where the amplifier is configured to produce an initial bandgap voltage reference, during startup. The bandgap voltage reference during startup may not be accurate and stable in some examples. As described above, a startup current 226 is provided to amplifier 102 to bias amplifier 102 during startup.

Method 500 continues at 520, where the amplifier produces a PTAT current. As shown in one example herein, amplifier 102, bandgap circuit 108, and other circuitry produce PTAT current 236. Current 230 is a fraction of PTAT current 236, and is useful for biasing amplifier 102 during steady state operation.

Method 500 continues at 530, where a current source provides a second bias current to the amplifier after startup of the amplifier, where the second bias current is based at least in part on the PTAT current. In one example, current source 228 provides the second bias current (e.g., current 230) to amplifier 102. Current 230 is a fraction of PTAT current 236, and is therefore proportional to changes in temperature. Current 230 may be more accurate and stable than the startup current 226.

Method 500 continues at 540, where, responsive to providing the second bias current to the amplifier, a current source reduces the first bias current provided to the amplifier. In examples, current 230 is provided to amplifier 102 to bias amplifier 102 after startup and during steady state operation. As current 230 increases, the current source that provides startup current 226 may be turned off to reduce the startup current 226, as that startup current 226 is not needed by amplifier 102 during steady state operation. In an example, current 224 provided by current source 220 is configured to turn off the current mirror that includes transistors 212 and 214, which cuts off startup current 226 so that it is no longer provided to transistor M2 232. In some examples, startup current 226 may begin to reduce after current 230 reaches a first predetermined threshold, and may become zero as current 230 reaches a second predetermined threshold and current source 220 has fully turned off the current mirror of transistors 212 and 214.

In examples herein, a reliable amplifier biasing circuit is described that supports wide temperature and input voltage variations and produces a stable bias current. The examples herein use the PTAT current as a reference to determine switching from the auxiliary (startup) bias current to the PTAT current. Also, if the PTAT current falls during operation, the startup current is configured to turn on and again provide bias current for the amplifier, until the PTAT current increases to a suitable level.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A system comprising:
   an amplifier having an output;
   a switching circuit coupled to the output of the amplifier and configured to provide a bias current to bias the amplifier;
   first current generating circuitry coupled to the switching circuit; and
   second current generating circuitry coupled to the output of the amplifier and to the switching circuit;
   wherein the switching circuit is further configured to:
      provide the bias current, during a first time period, in response to a first signal generated by the first current generating circuitry,
      provide the bias current, during a second time period, after the first time period, in response to a second signal generated by the second current generating circuitry, and
      provide the bias current, during a third time period, in response to both the first and second signals, the third time period being between the first time period and the second time period.

2. The system of claim 1, wherein the second signal is a proportional to absolute temperature (PTAT) current.

3. The system of claim 1, wherein, during the third time period, the first signal reduces and the second signal increases.

4. The system of claim 1, further comprising:
   a bandgap circuit coupled to the output of the amplifier;
   wherein the switching circuit is further configured to:
   generate a startup current that increases during a beginning portion of the first time period and decreases during the third time period; and
   generate an operating current in response to the PTAT current, which increases in response to a bandgap voltage at the output of the amplifier.

5. The system of claim 4, wherein the switching circuit has an output at which a driving current is output, the driving current including one of the startup current, the operating current, and a combination of the startup current and the operating current.

6. The system of claim 5, further comprising:
   a current mirror coupled to the switching circuit and to the amplifier, the current mirror having an input configured to receive the driving current and mirror the driving current as the bias current for the amplifier.

7. The system of claim 1, wherein the switching circuit includes a current mirror configured to generate a startup current that increases during a beginning portion of the first time period and decreases during the third time period.

8. The system of claim 7, wherein the current mirror includes:
   a first transistor having a control terminal, a first current terminal adapted to be coupled to a power supply, and a second current terminal; and
   a second transistor having a control terminal coupled to the control terminal of the first transistor, a first current terminal adapted to be coupled to the power supply, and a second current terminal at which the startup current is generated.

9. The system of claim 8, wherein the switching circuit comprises a controlled current source having an output coupled to the second current terminal, the controlled current source configured to deliver a controlled current.

10. The system of claim 9, wherein the switching circuit is further configured to turn off the first transistor in response to a magnitude of the controlled current reaching a threshold.

11. The system of claim 1, wherein the first current generating circuitry includes a current mirror.

12. A switching circuit comprising:
    a constant current source;
    first and second transistors coupled to the constant current source in a current mirror configuration, each of the first and second transistors having a control terminal, a first current terminal, and a second current terminal, the second current terminal of the first transistor coupled to the constant current source, and the second current terminal of the second transistor forming a current output of the switching circuit;

a first controlled current source having an output coupled to the second current terminal of the first transistor, the first controlled current source configured to deliver a first controlled current that is based on a proportional to absolute temperature (PTAT) current; and a second controlled current source having an output coupled to the second current terminal of the second transistor, the second controlled current source configured to deliver a second controlled current that is based on the PTAT current;

wherein the switching circuit is configured to generate a startup current during a first time period, the startup current based on a constant current output by the constant current source and sizes of the first and second transistors.

13. The switching circuit of claim 12, wherein the switching circuit is further configured to generate an operating current during a second time period, after the first time period, the operating current based on the first and second controlled current sources.

14. The switching circuit of claim 13, wherein the switching circuit is further configured to generate both the startup current and the operating current during a third period of time, between the first and second time periods, during which the startup current decreases and the operating current increases.

15. A switching circuit comprising:
a constant current source;
first and second transistors coupled to the constant current source in a current mirror configuration, each of the first and second transistors having a control terminal, a first current terminal, and a second current terminal, the second current terminal of the first transistor coupled to the constant current source, and the second current terminal of the second transistor forming a current output of the switching circuit;
a first controlled current source having an output coupled to the second current terminal of the first transistor, the first controlled current source configured to deliver a first controlled current that is based on a proportional to absolute temperature (PTAT) current, and the turns off the first transistor when the first controlled current reaches a threshold current level; and
a second controlled current source having an output coupled to the second current terminal of the second transistor, the second controlled current source configured to deliver a second controlled current that is based on the PTAT current.

16. A method comprising:
generating a startup current using first and second transistors and a constant current source coupled as a current mirror;
generating a bias current for an amplifier using the startup current;
generating a bandgap voltage based on operation of the amplifier;
activating and operating first and second controlled current sources to deliver first and second controlled currents, respectively, based on a proportional to absolute temperature (PTAT) current;
generating the bias current using both the startup current and the second controlled current during a time period in which the startup current is decreasing and the second controlled current is increasing;
generating an operating current using the second controlled current source; and
turning off the first transistor when the first controlled current reaches a threshold level.

17. The method of claim 16, further comprising:
generating the bias current using the second controlled current after the startup current reduces to approximately zero.

18. The system of claim 1, wherein the amplifier includes a bandgap amplifier having first and second inputs configured to receive first and second voltages, respectively.

19. The method of claim 16, wherein the amplifier includes a bandgap amplifier having first and second inputs, wherein the generating of the bandgap voltage based on operation of the amplifier includes:
inputting a first voltage to the first input of the bandgap amplifier, and inputting a second voltage to the second input of the bandgap amplifier.

* * * * *